United States Patent
Lundby et al.

(10) Patent No.: US 7,336,722 B2
(45) Date of Patent: Feb. 26, 2008

(54) METHOD AND APPARATUS FOR PUNCTURING CODE SYMBOLS IN A COMMUNICATIONS SYSTEM

(75) Inventors: Stein Lundby, San Diego, CA (US); Lorenzo Casaccia, Frassineto Po (IT); Leonid Razoumov, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 717 days.

(21) Appl. No.: 10/741,184

(22) Filed: Dec. 18, 2003

(65) Prior Publication Data

US 2004/0133841 A1 Jul. 8, 2004

Related U.S. Application Data

(63) Continuation of application No. 09/587,168, filed on Jun. 2, 2000, now Pat. No. 6,690,734.

(51) Int. Cl.
*H04L 27/00* (2006.01)

(52) U.S. Cl. .......................... 375/295; 341/94; 342/77; 348/466; 370/320; 375/240.27; 714/790

(58) Field of Classification Search ................ 370/468; 375/280; 714/755, 790, 781, 786
See application file for complete search history.

(56) References Cited

U.S. PATENT DOCUMENTS 5,668,820 A * 9/1997 Ramesh et al. ............. 714/786

5,938,787 A * 8/1999 Stark .......................... 714/755

OTHER PUBLICATIONS

Begin and Haccoun; High rate punctured convolutional codes: structure properties and construction technique; Dec. 1989; IEEE Transactions on Communications; pp. 1381-1385.*

* cited by examiner

*Primary Examiner*—David C. Payne
*Assistant Examiner*—Adolf DSouza
(74) *Attorney, Agent, or Firm*—Thomas R. Rouse; David J. Huffaker (57) ABSTRACT

Techniques for puncturing symbols in a communications system. S symbols are received for a frame having a capacity of N symbols, with S being greater than N. P symbols need to be punctured so that remaining symbols fit into the frame. A number of puncture distances, D1 through DN, are computed based on S and P. A particular number of symbol punctures is determined for each computed puncture distance. P1 through PN symbol punctures are then performed at the distances of D1 through DN, respectively. For a more even distribution of the symbol punctures, each of the distances D1 through DN can be selected to be greater than or equal to a minimum puncture distance Dmin defined as Dmin=$\lfloor S/P \rfloor$, where $\lfloor \, \rfloor$ denotes a floor operator. The symbol punctures at each computed distance can be performed together or distributed with symbol punctures at other distances.

12 Claims, 7 Drawing Sheets

METHOD AND APPARATUS FOR PUNCTURING CODE SYMBOLS IN A COMMUNICATIONS SYSTEM

CLAIM OF PRIORITY UNDER 35 U.S.C. §120

The present Application for Patent is a Continuation and claims priority to patent application Ser. No. 09/587,168 entitled "Method and Apparatus for Puncturing Code Symbols in a Communications System" filed Jun. 2, 2000 now U.S. Pat. No. 6,690,734, now allowed, and assigned to the assignee hereof and hereby expressly incorporated by reference herein.

BACKGROUND OF THE INVENTION

1. Field of the Invention

The present invention relates to data communications. More particularly, the present invention relates to method and apparatus for puncturing code symbols to provide improved performance in a communications system.

2. Background

In a typical digital communications system, data is processed, modulated, and conditioned at a transmitter unit to generate a modulated signal that is then transmitted to one or more receiver units. The data processing may include, for example, formatting the data into a particular frame format, encoding the formatted data with a particular coding scheme to provide error detection and/or correction at the receiver unit, puncturing (i.e., deleting) some of the code symbols to fit within a particular frame size, channelizing (i.e., covering) the encoded data, and spreading the channelized data over the system bandwidth. The data processing is typically defined by the system or standard being implemented.

At the receiver unit, the transmitted signal is received, conditioned, demodulated, and digitally processed to recover the transmitted data. The processing at the receiver unit is complementary to that performed at the transmitter unit and may include, for example, despreading the received samples, decovering the despread samples, inserting "erasures" in place of punctured symbols, and decoding the symbols to recover the transmitted data.

A digital communications system typically employs a convolutional code or a Turbo code to provide error correction capability at the receiver unit. The ability to correct transmission errors enhances the reliability of a data transmission. Conventionally, convolutional and Turbo coding is performed using a particular polynomial generator matrix that generates a particular number of code symbols (e.g., 2, 3, or more code symbols) for each input data bit. For example, a rate 1/2 encoder generates two code symbols for each data bit.

A multiple access communications system typically transmits data in frames or packets of predetermined sizes to allow for efficient sharing of system resources among active users. For example, some communications systems support frame sizes that are multiple times a basic frame size (e.g., 768·K bits, where K=1, 2 . . . ). For efficiency, some communications systems also support multiple data rates. Depending on a number of factors, a variable number of data bits (i.e., X) may be provided to the encoder, which then generates a corresponding number of code symbols (e.g., 2X).

In certain instances, the number of code symbols generated is not exactly equal to the capacity of the frame Symbol repetition and puncturing are then used to fit the generated code symbols into a frame of a particular size. For example, if the number of code symbols is less than the frame capacity, some or all of the code symbols may be repeated (i.e., duplicated) a particular number of times. Conversely or additionally after the symbol repetition, if the number of code symbols is greater than the frame capacity, some of the code symbols may be deleted (i.e., punctured).

One conventional method for puncturing code symbols is to systematically puncture one symbol out of every Dth symbols until the required number of symbol punctures is achieved. The remaining symbols are then sent unmodified. In certain situations, this method can puncture symbols unevenly throughout an entire frame, which results in more symbols being punctured in one portion of the frame and less or no symbols being punctured in some other portion of the frame. When symbols are unevenly punctured, performance may be compromised.

As can be seen, techniques that can be used to puncture symbols in a manner to provide improved performance are highly desirable.

SUMMARY OF THE INVENTION

The present invention provides various techniques for puncturing symbols to achieve a more even distribution of symbol punctures throughout an entire frame, which can result in improved system performance. Generally, a number of puncture distances are computed, and the required symbol punctures are performed using the computed distances. A puncture distance can be defined as the periodicity of the symbol punctures. By properly selecting the puncture distances, and using the selected distances at the appropriate time, the desired puncture results can be achieved.

An embodiment of the invention provides a method for puncturing symbols in a communications system (e.g., a system that conforms to CDMA-2000, W-CDMA, or 1XTREME standard, which are identified below). In accordance with the method, S symbols are received for a frame having a capacity of N symbols, with S being greater than N. P symbols need to be punctured from the S received symbols such that the remaining unpunctured symbols fit into the frame. A number of puncture distances, D1 through DN, are then computed based on the S received symbols and the P symbol punctures. Next, a particular number of symbol punctures is determined for each computed puncture distance. P1 through PN symbol punctures are then performed at the puncture distances of D1 through DN, respectively. For a more even distribution of the symbol punctures, each of the distances D1 through DN can be selected to be greater than or equal to a minimum puncture distance Dmin defined as:

$$Dmin = \left\lfloor \frac{S}{P} \right\rfloor,$$

where ⌊ ⌋ denotes a floor operator.

In a simple implementation, two puncture distances, D1 and D2, can be computed based on S and P as follows:

$$D1 = \left\lfloor \frac{S}{P} \right\rfloor, \text{ and}$$

-continued $$D2 \begin{cases} D1 & \text{if } D1*P = S \\ D1+1 & \text{otherwise.} \end{cases}$$

P1 and P2 can then be computed as:

$P2=S-P*D1$, and $P1=P-P2$.

The symbol puncturing can be achieved by (1) selecting either the puncture distance of D1 or D2 to be used to determine which symbol should be punctured next, (2) puncturing the next symbol based on the selected puncture distance, and (3) decrementing P1 or P2 based on the selected puncture distance. Steps (1) through (3) can be repeated until all P1 and P2 symbol punctures are achieved. The puncture distance can be selected such that the P1 symbol punctures at the distance of D1 are distributed among the P2 symbol punctures at the distance of D2. For example, if the ratio of P1 to P2 is equal to R, then the puncture distance can be selected such that, on an average, R symbol punctures are performed at the distance of D1 for each symbol puncture at the distance of D2. Alternatively, P1 symbol punctures at the distance of D1 can be performed, followed by P2 symbol punctures at the distance of D2. The method can thus be used to provide a rich set of patterns of puncture distances D1 and D2 that can provide improved performance.

The above concepts for two puncture distances can be applied to the general case in which N puncture distances are computed and used. The symbol punctures at each computed distance can be performed together or distributed with symbol punctures at other distances.

Prior to the symbol puncturing, the code symbols may have been repeated to generate the S received symbols. For example, in the CDMA-2000 system, each code symbol may be repeated M times, with M being an integer greater than or equal to one and selected such that S is greater than or equal to N. Also, the code symbols are typically generated by coding a number of data bits with a particular coding scheme (e.g., a convolutional or Turbo code).

Another embodiment of the invention provides a method for decoding symbols in a communications system. In accordance with the method, N symbols are initially received. It is then determined that P symbol punctures had been performed on S symbols to generate the N received symbols. A number of puncture distances, D1 through DN, is then computed based on S and P, and P1 through PN symbol punctures at the distances of D1 through DN, respectively, are also determined. A puncturing pattern used to puncture the S symbols to generate the N received symbols is then derived based on the P1 through PN symbol punctures at the distances of D1 through DN, respectively. P erasures are then inserted among the N received symbols based on the derived puncturing pattern to generate S recovered symbols, which are then decoded with a particular decoding scheme. Again, for a more even distribution of the erasures/symbol punctures, each of the distances D1 through DN can be selected to be greater than or equal to a minimum puncture distance Dmin defined above.

Yet another embodiment of the invention provides a transmit data processor for use in a communications system. The transmit data processor includes an encoder coupled to a symbol puncturing element. The encoder receives and codes data bits to generate code symbols. The symbol puncturing element (1) receives S symbols for a frame having a capacity of N symbols, with S being greater than N, (2) determines P symbols to be punctured from the S received symbols such that the remaining unpunctured symbols fit into the frame, (3) computes the puncture distances of D1 through DN based on S and P, (4) determines P1 through PN symbol punctures to be performed at the distances of D1 through DN, respectively, and (5) performs P1 through PN symbol punctures on the S received symbols at the puncture distances of D1 through DN, respectively. The symbol puncturing element can be designed to implement various features described above (e.g., distribute the P1 and P2 punctures over the entire frame). Again, each of the puncture distances of D1 through DN can be selected to be greater than or equal to a minimum puncture distance Dmin defined above.

The transmit data processor can further include a symbol repeating element that couples to the encoder and the symbol puncturing element. The symbol repeating element receives the code symbols from the encoder and repeats each received code symbol M times to generate the S symbols, with M being an integer greater than or equal to one.

Yet another embodiment of the invention provides a receiver unit for use in a communications system. The receiver unit includes a receiver, a demodulator, and a receive data processor coupled in cascade. The receiver receives and processes a modulated signal to provide a number of samples for each received frame. The demodulator processes the samples to provide N symbols for each received frame. The receive data processor (1) receives the N symbols, (2) determines that P symbol punctures had been performed on S symbols to generate the N received symbols, (3) computes a number of puncture distances, D1 through DN, based on S and P, (4) determines P1 through PN symbol punctures that had been performed at the distances of D1 through DN, respectively, (5) derives a puncturing pattern (e.g., based on D1 through DN, and P1 through PN) used to puncture the S symbols to generate the N received symbols, (6) inserts P erasures among the N received symbols in accordance with the derived puncturing pattern to generate S recovered symbols, and (7) decodes the S recovered symbols with a particular decoding scheme.

Other aspects and embodiments of the invention are described below.

BRIEF DESCRIPTION OF THE DRAWINGS

The features, nature, and advantages of the present invention will become more apparent from the detailed description set forth below when taken in conjunction with the drawings in which like reference characters identify correspondingly throughout and wherein.

DETAILED DESCRIPTION OF THE SPECIFIC EMBODIMENTS

Figure 1:
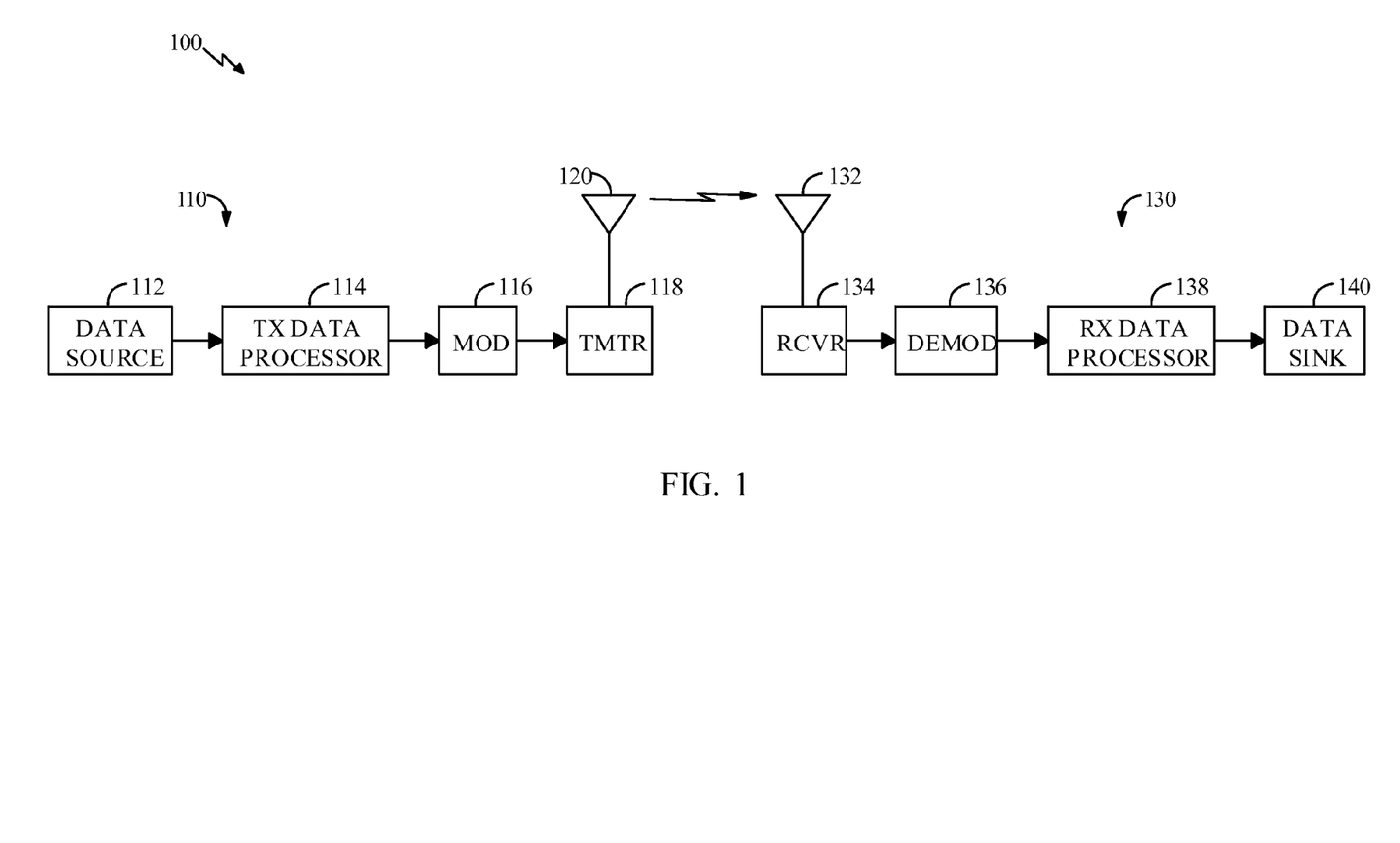
FIG. 1 is a simplified block diagram of a communications system in which the present invention may be implemented.

FIG. 1 is a simplified block diagram of an embodiment of a communications system 100 in which the present invention may be implemented. At a transmitter unit 110, traffic data is sent, typically in frames or packets, from a data source 112 to a transmit (TX) data processor 114 that formats, encodes, and interleaves (i.e., reorders) the data in accordance with a particular processing scheme. TX data processor 114 typically further processes signal and control data (e.g., pilot and power control data). A modulator (MOD) 116 then receives, channelizes (i.e., covers), and spreads the processed data to generate symbols that are then converted to analog signals. The analog signals are filtered, quadrature modulated, amplified, and upconverted by a transmitter (TMTR) 118 to generate a modulated signal, which is then transmitted via an antenna 120 to one or more receiver units.

At a receiver unit 130, the transmitted signal is received by an antenna 132 and provided to a receiver (RCVR) 134. Within receiver 134, the received signal is amplified, filtered, downconverted, quadrature demodulated, and digitized to provide data samples. The samples are despread, decovered, and demodulated by a demodulator (DEMOD) 136 to generate demodulated symbols. A receive (RX) data processor 138 then reorders and decodes the demodulated symbols to recover the transmitted data. The processing performed by demodulator 136 and RX data processor 138 is complementary to the processing performed at transmitter unit 110. The recovered data is then provided to a data sink 140.

The signal processing described above supports transmissions of voice, video, packet data, messaging, and other types of communication in one direction. A bi-directional communications system supports two-way data transmission. However, the signal processing for the other direction is not shown in FIG. 1 for simplicity.

Communications system 100 can be a code division multiple access (CDMA) system, a time division multiple access (TDMA) communications system (e.g., a GSM system), a frequency division multiple access (FDMA) communications system, or other multiple access communications system that supports voice and data communication between users over a terrestrial link.

The use of CDMA techniques in a multiple access communications system is disclosed in U.S. Pat. No. 4,901,307, entitled "SPREAD SPECTRUM MULTIPLE ACCESS COMMUNICATION SYSTEM USING SATELLITE OR TERRESTRIAL REPEATERS," and U.S. Pat. No. 5,103,459, entitled "SYSTEM AND METHOD FOR GENERATING WAVEFORMS IN A CDMA CELLULAR TELEPHONE SYSTEM". Another specific CDMA system is disclosed in U.S. Pat. No. 6,574,211 entitled "METHOD AND APPARATUS FOR HIGH RATE PACKET DATA TRANSMISSION," issued Jun. 3, 2003 (hereinafter referred to as the HDR system). These patents are assigned to the assignee of the present invention and incorporated herein by reference.

CDMA systems are typically designed to conform to one or more standards such as the "TIA/EIA/IS-95-A Mobile Station-Base Station Compatibility Standard for Dual-Mode Wideband Spread Spectrum Cellular System" (hereinafter referred to as the IS-95-A standard), the "TIA/EIA/IS-98 Recommended Minimum Standard for Dual-Mode Wideband Spread Spectrum Cellular Mobile Station" (hereinafter referred to as the IS-98 standard), the standard offered by a consortium named "3rd Generation Partnership Project" (3GPP) and embodied in a set of documents including Document Nos. 3G TS 25.211, 3G TS 25.212, 3G TS 25.213, and 3G TS 25.214 (hereinafter referred to as the W-CDMA standard), and the "TR-45.5 Physical Layer Standard for cdma2000 Spread Spectrum Systems" (hereinafter referred to as the CDMA-2000 standard). New CDMA standards are continually proposed and adopted for use. These CDMA standards are incorporated herein by reference.

Figure 2:
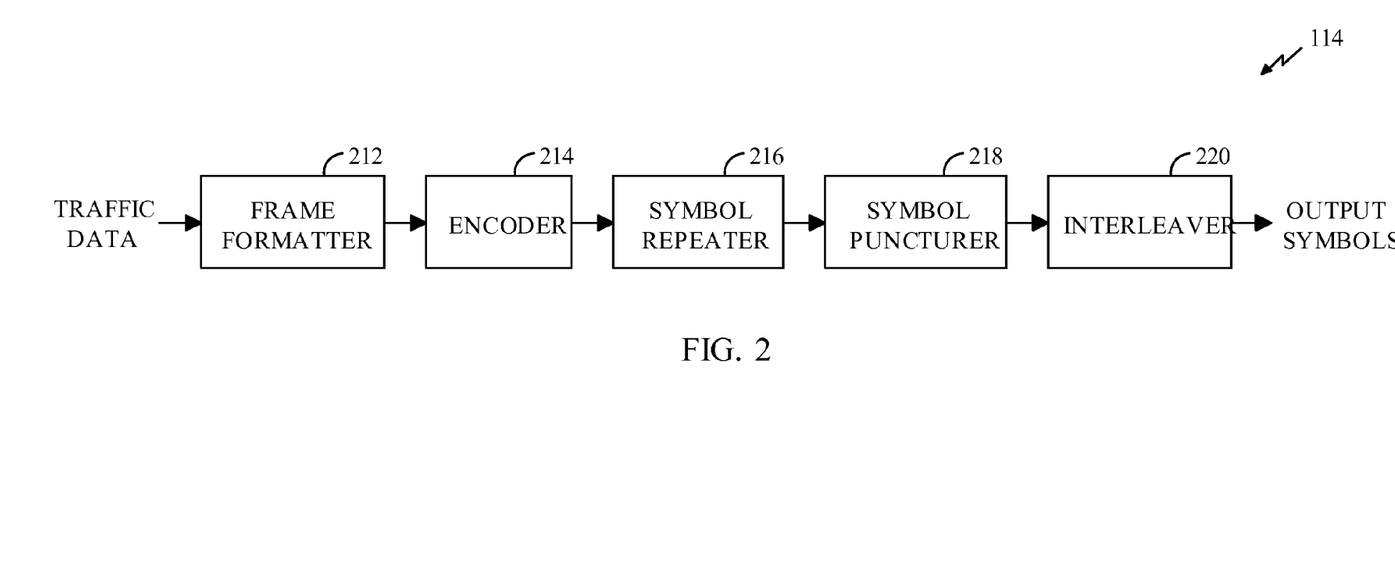
FIG. 2 is a block diagram of a transmit data processor that can be designed to implement some embodiments of the present invention.

FIG. 2 is a block diagram of an embodiment of TX data processor 114, which can be designed to implement some embodiments of the present invention. Traffic data is received (again, typically in frames or packets) by a frame formatter 212 that formats each received frame in a particular manner. For example, frame formatter 212 can perform cycle redundancy check (CRC) coding on each frame of data and append the CRC bits to the frame. Frame formatter 212 typically further adds a number of code-tail bits to the end of each frame. The code-tail bits typically have values of zero and are used to set the subsequent encoder to a known state (e.g., all zeros) after the frame has been coded. Other frame formatting functions may also be performed by frame formatter 212.

The formatted frames are then provided to an encoder 214 that codes each frame with a particular coding scheme to generate a corresponding frame of code symbols. For example, encoder 214 may perform convolutional or Turbo coding of a data frame. The particular coding scheme used is dependent on the particular system or standard being implemented and may be selectable (e.g., different coding schemes may be used for different types of services). The coding schemes used for the CDMA-2000 and W-CDMA systems are described in detail in the aforementioned standard documents.

The coded frames are then provided to a symbol repeater 216. Depending on the number of code symbols generated for a particular frame and the capacity of the frame, zero or more symbols may be repeated. For example, in accordance with the CDMA-2000 standard, each symbol in a particular frame is repeated an integer number of time (i.e., M=1, 2, 3, and so on), with the integer number M being selected such that the number of symbols after repetition minimally exceeds the capacity of the frame. Thus, if L code symbols are generated by encoder 214 for a particular frame and the frame has a capacity of N symbols (where $N \geq L$), then each symbol in the frame is repeated M times, where M is computed as $M = \lceil N/L \rceil$. The symbol "⌈ ⌉" represents a ceiling operator, which provides the next greater integer. For example, if N/L=5.2, then $\lceil N/L \rceil = 6$.

In many instances, the number of code symbols after repetition is not equal to the frame size (i.e., the number of code symbols exceeds the capacity of the frame). When this occurs, some of the code symbols are deleted (i.e., punctured) so that the resultant number of code symbols matches the capacity of the frame. Symbol repetition and puncturing are described in further detail below.

The punctured frames are then provided to an interleaver 220. The code symbols for each frame are typically written to interleaver 220 in a particular write order (e.g., sequentially) and, after an entire frame has been stored, the code symbols are retrieved in a particular read order that is typically different from the write order to achieve the reordering of the symbols. Again, the interleaving scheme is typically defined by the particular system or standard being implemented.

Figure 3A:
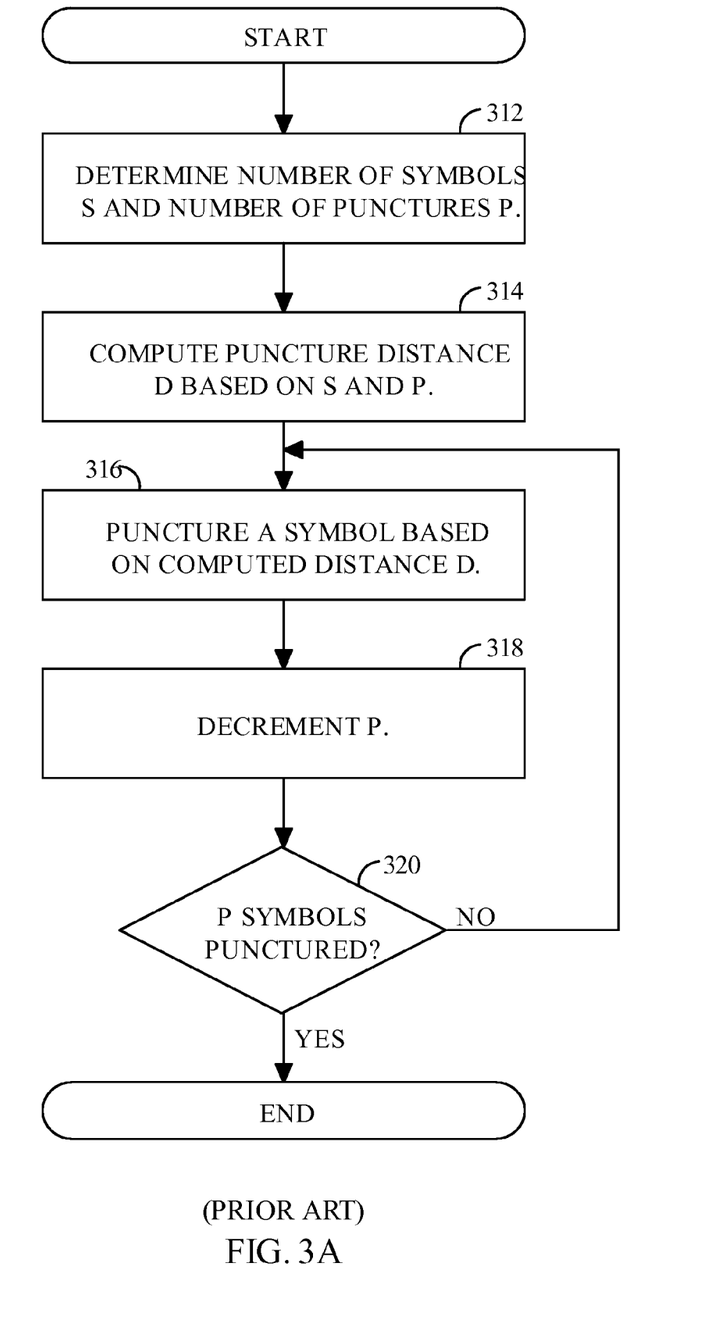
FIG. 3A is a flow diagram of a conventional symbol puncturing technique, which is described in the CDMA-2000 standard.

FIG. 3A is a flow diagram of a conventional symbol puncturing technique, which is described in the CDMA-2000 standard. Initially, the number of generated code symbols S and the number of required punctures P for a particular frame are determined, at step 312. Referring back to FIG. 2, S code symbols are generated by symbol repeater 216 for a particular frame. If the frame has a capacity of N symbols and if $S \geq N$, then P symbols are punctured, where P=S−N. If P is equal to zero then puncturing is not required. Otherwise, a puncture distance D is computed, at step 314, based on the determined number of symbols S and the number of punctures P. The puncture distance is the number of symbols between two consecutive puncture symbols, plus 1, wherein the first puncture occurs at the Dth symbol in the frame. For example, if D=3, then there would be two unpunctured symbols before the next puncture. In accordance with the CDMA-2000 standard, the puncture distance D is computed as:

$$D = \left\lfloor \frac{S}{P} \right\rfloor, \qquad \text{Eq (1)}$$

where the symbol "$\lfloor \ \rfloor$" denotes the floor operator, which provides the next lower integer. For example, if S/P=5.2, then $\lfloor S/P \rfloor$=5.

Symbols in the frame are then punctured using the computed distance D. To perform a symbol puncture, symbols in the frame are counted, starting with the first symbol, and the Dth symbol is punctured, at step 316. After a symbol has been punctured, the number of required punctures P is decremented, at step 318. A determination is then made whether all P symbols have been punctured, at step 320. This determination can be made by simply checking whether. P=0. If all P symbols have been punctured, the process terminates. Otherwise, the process returns to step 316 and another symbol is punctured, again based on the previously computed distance D.

The conventional symbol puncturing technique described in FIG. 3A can provide varied punctured results, depending on the particular values of S and P. Specifically, the punctured symbols may be evenly distributed throughout the frame for some values of S and P, or may be concentrated in one portion of the frame for some other values of S and P. These varied punctured results can be illustrated by the following simple examples.

Figure 3B:
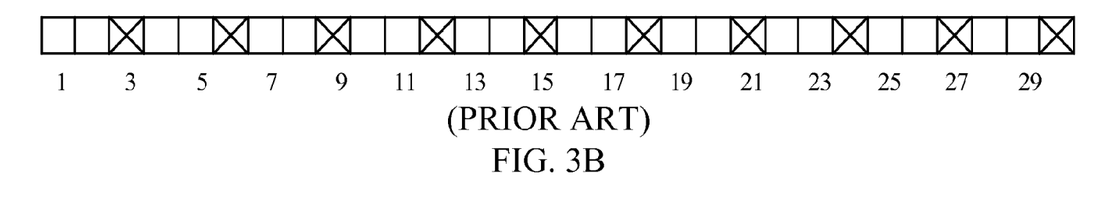
FIGS. 3B and 3C are diagrams that show two simple puncturing examples using the conventional symbol puncturing technique described in FIG. 3A.

FIG. 3B is a diagram that illustrates a simple example using the conventional symbol puncturing technique described in FIG. 3A. In this specific example, 30 symbols are generated (i.e., S=30) but (for this example) only 20 symbols can be fitted into a frame (i.e., N=20). Thus, 10 symbols need to be punctured (i.e., P=S−N=30−20=10). Using equation (1), the puncture distance D can be computed as 3. As shown in FIG. 3B, every 3rd symbol is punctured, as represented by the boxes with the X. In this specific example, the punctured symbols are uniformly distributed across the entire frame.

Figure 3C:
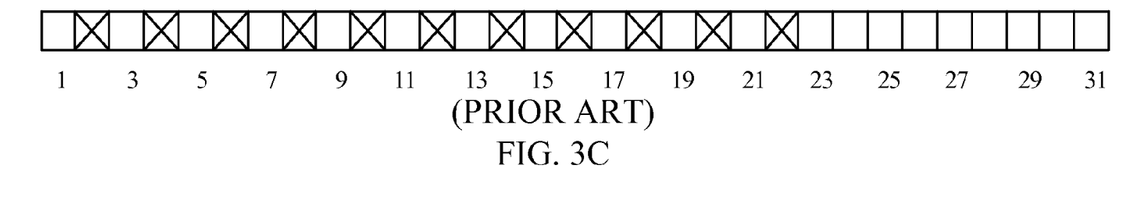

FIG. 3C is a diagram that illustrates another simple example using the conventional symbol puncturing technique, but for different values of S and P. In this specific example, 31 symbols are generated (i.e., S=31) and 20 symbols may be fitted into a frame (i.e., N=20). Thus, 11 symbols need to be punctured (i.e., P=11). Using equation (1), the puncture distance D can be computed as 2. As shown in FIG. 3C, every 2nd symbol is punctured, as represented by the boxes with the X, until all 11 symbols have been punctured. After the 11th symbol has been punctured, the remaining symbols are passed unmodified. As shown in this specific example, the punctured symbols are concentrated toward the front portion of the frame, while the back portion of the frame is left unchanged. The uneven distribution of punctured symbols results from puncturing the symbols with a high puncture rate (i.e., a short puncture distance D).

FIGS. 3B and 3C illustrate the varied punctured results that can be obtained using the conventional puncturing technique. The puncturing pattern changes from a uniform distribution in FIG. 3B to an uneven distribution in FIG. 3C as a result of simply increasing the number of code symbols S by one. The conventional puncturing technique thus has "critical" points in which, because of the discrete floor operator $\lfloor \ \rfloor$, the puncturing distance D changes by one whole unit when S is increased by one.

The uneven distribution of the punctured symbols in FIG. 3C can result in performance degradation at the receiver unit. Deletion of symbols is equivalent to reducing the transmit power for those symbols to zero. For convolutionally coded data, a Viterbi decoder is used at the receiver unit to decode the symbols. The Viterbi decoder provides improved performance (i.e., better error correcting capability) if code symbols received in error are more uniformly spread across an entire frame. By puncturing more symbols in one portion of a frame, the Viterbi decoder may not be able to correct symbol errors in that portion of the frame, and an entire frame may be declared erased (i.e., received in error).

Figure 4A:
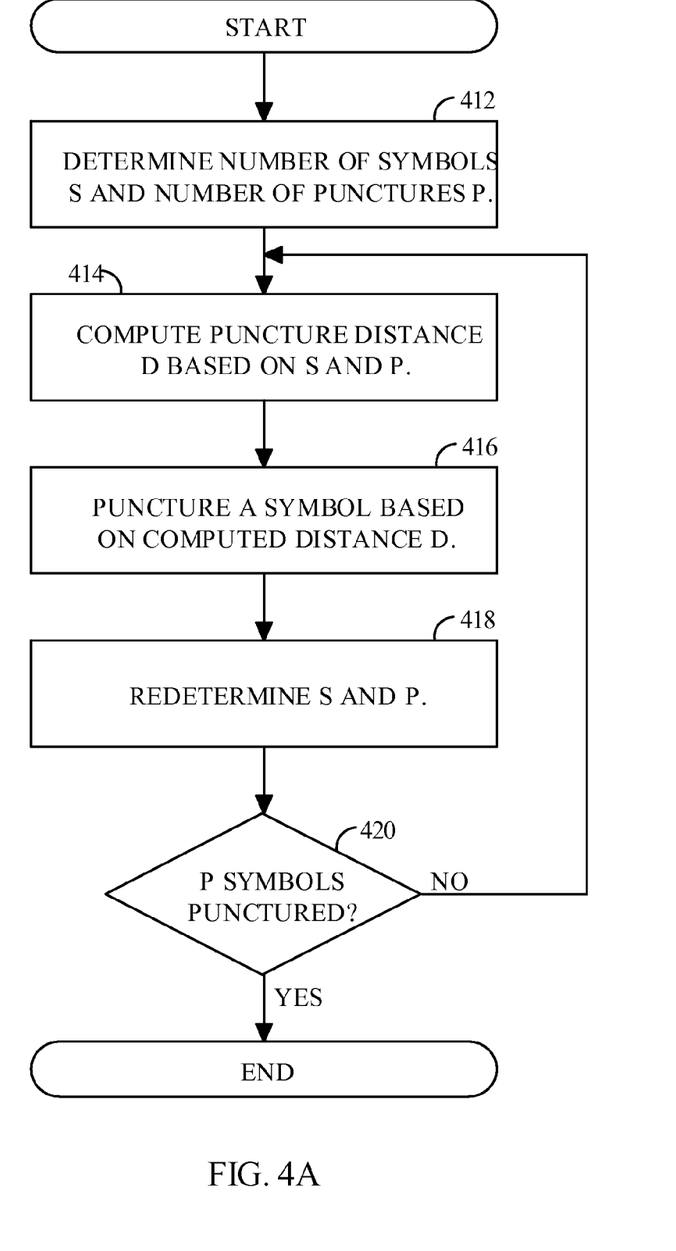
FIG. 4A is a flow diagram of an embodiment of a symbol puncturing technique of the present invention.

FIG. 4A is a flow diagram of an embodiment of a symbol puncturing technique of the present invention. Initially, the number of generated code symbols S and the number of required punctures P for a particular frame are determined, at step 412. If the frame has a capacity of N symbols and if $S \geq N$, then P symbols are punctured, where P=S−N. If P is equal to zero then puncturing is not required. Otherwise, the puncture distance D is computed based on the determined number of symbols S and the number of punctures P, at step 414. The puncture distance D can be computed using equation (1).

Symbols in the frame are then punctured using the computed distance D. To perform a symbol puncture, symbols in the frame are counted, initially starting with the first symbol, and the Dth symbol is punctured, at step 416. After a symbol has been punctured, the number of remaining symbols is determined (i.e., $S_{n+1}=S_n-D$), and the number of required punctures P is decremented (i.e., $P_{n+1}=P_n-1$), at step 418. A determination is then made whether all P symbols have been punctured, at step 420. Again, this determination can be made by simply checking whether P=0. If all P symbols have been punctured, the process terminates. Otherwise, the process returns to step 414 and the puncture distance D is recomputed based on the updated values for S and P. Symbols are counted from there onwards and the Dth symbol is punctured, at step 416. The process then continues until all P symbols have been punctured.

The symbol puncturing technique shown in FIG. 4A recomputes the puncture rate (i.e., the puncture distance D) in "real-time" after each puncture. The new "puncture distance" (i.e., the number of symbols until the next puncture) is computed based on the number of symbols still remaining and the number of punctures still to be performed. Each computation generates a new puncture distance D that attempts to uniformly distribute the remaining symbol punctures.

For a clearer understanding, the puncturing technique described in FIG. 4A can be applied to the example shown in FIG. 3B in which 31 code symbols are generated (i.e., L=31) and the frame has a capacity of 20 symbols (i.e., N=20). Again, 11 symbol punctures are required. Table 1 lists the parameters S, P, and D for each puncture (i.e., for each pass through the loop shown in FIG. 4A).

TABLE 1

| Parameters | S | P | D |
|---|---|---|---|
| start | 31 | 11 | D = ⌊31/11⌋ = 2 |
| after 1st puncture | 29 | 10 | D = ⌊29/10⌋ = 2 |
| after 2nd puncture | 27 | 9 | D = ⌊27/9⌋ = 3 |
| after 3rd puncture | 24 | 8 | D = ⌊24/8⌋ = 3 |
| after 4th puncture | 21 | 7 | D = ⌊21/7⌋ = 3 |
| after 5th puncture | 18 | 6 | D = ⌊18/6⌋ = 3 |
| after 6th puncture | 15 | 5 | D = ⌊15/5⌋ = 3 |
| after 7th puncture | 12 | 4 | D = ⌊12/4⌋ = 3 |
| after 8th puncture | 9 | 3 | D = ⌊9/3⌋ = 3 |
| after 9th puncture | 6 | 2 | D = ⌊6/2⌋ = 3 |
| after 10th puncture | 3 | 1 | D = ⌊3/1⌋ = 3 |

Figure 4B:
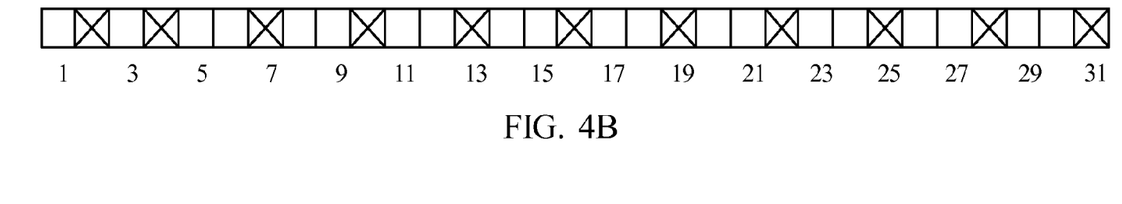
FIG. 4B is a diagram that shows a puncturing example using the symbol puncturing technique described in FIG. 4A.

FIG. 4B is a diagram that shows the results of the puncturing example described in Table 1. For the first two punctures, the distance is computed as two (i.e., D=2). After the second symbol puncture, the remaining symbols are punctured with a distance of three (i.e., D=3). When comparing the puncture pattern shown in FIG. 4B versus the puncture pattern shown in FIG. 3C, it can be observed that the symbol puncturing technique of the invention provides a much more even distribution of punctured symbols.

Figure 5A:
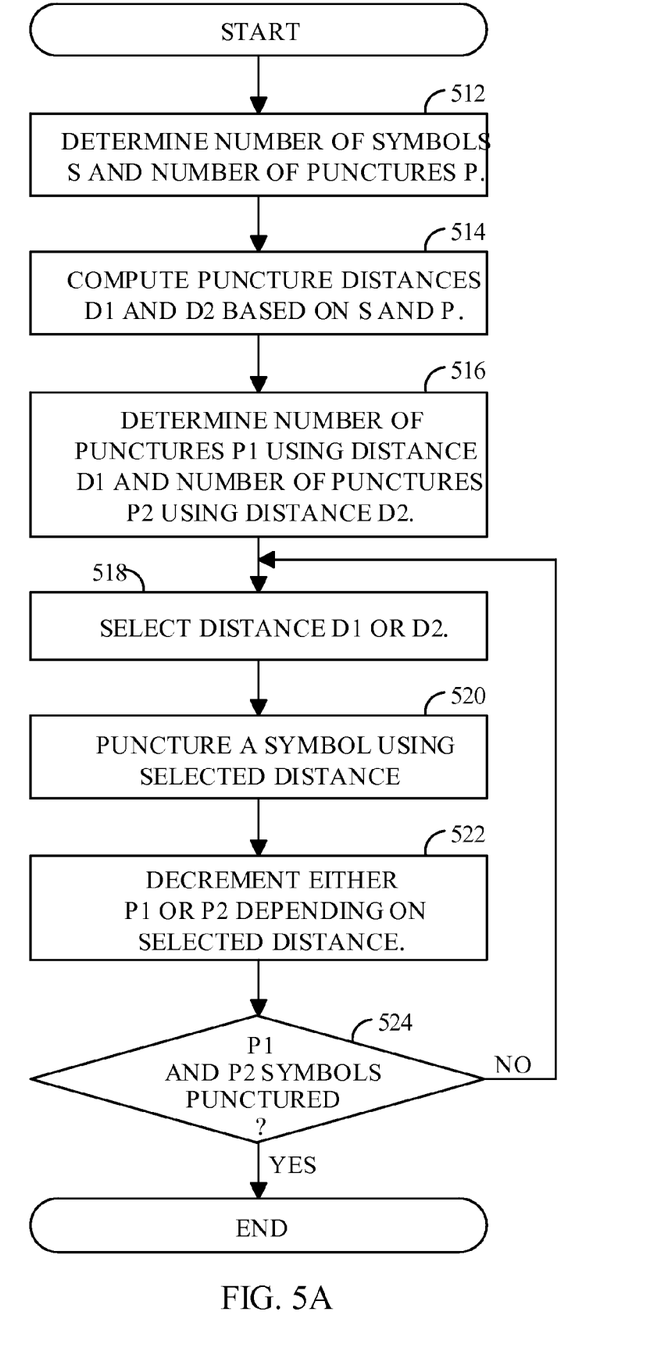
FIG. 5A is a flow diagram of an embodiment of another symbol puncturing technique of the present invention.

FIG. 5A is a flow diagram of an embodiment of another symbol puncturing technique of the present invention. Initially, the number of generated code symbols S and the number of required punctures P for a particular frame are determined, at step 512. Again, if the frame has a capacity of N symbols and if S≧N, then P symbols are punctured, where P=S−N. If P is equal to zero then puncturing is not required. Otherwise, two puncture distances D1 and D2 are computed, at step 514, based on the determined number of symbols S and the number of punctures P.

For every integer S and P, the following equality can be shown to be true:

$$P\left\lfloor\frac{S}{P}\right\rfloor \leq S \leq P\left\lceil\frac{S}{P}\right\rceil. \quad \text{Eq (2)}$$

Based on equation (2), two puncture distances D1 and D2 can be computed as:

$$D1 = \left\lfloor\frac{S}{P}\right\rfloor, \text{ and} \quad \text{Eq (3)}$$

$$D2 = \begin{cases} D1 & \text{if } D1*P = S \\ D1+1 & \text{otherwise.} \end{cases} \quad \text{Eq (4)}$$

From equations (3) and (4), D1 can be computed with one division operation and D2 can be computed as D1+1. However, other values for D1 and D2 can also be selected and are within the scope of the invention. For example, D1 can be chosen to equal ⌊S/P⌋ and D2 can be chosen to equal ⌈S/P⌉.

The number of punctures P1 using puncture distance D1 and the number of punctures P2 using puncture distance D2 are then computed, at step 516. The number of punctures P1 and P2 can be computed as:

$$P2=S-P*D1, \text{ and} \quad \text{Eq (5)}$$

$$P1=P-P2. \quad \text{Eq (6)}$$

The puncture distances D1 and D2 and the number of punctures P1 and P2 are related by the following:

$$S=P1 \cdot D1+P2 \cdot D2. \quad \text{Eq(7)}$$

Once the puncture distances D1 and D2 and the number of punctures P1 and P2 have been computed, one of the computed puncture distances is selected, at step 518. Various methods can be used to select either D1 or D2, as described below. A symbol in the frame is then punctured using the selected puncture distance. Again, to perform a symbol puncture, symbols in the frame are counted, starting with first symbol in the frame or the last punctured symbol, and the D1th or D2th symbol is punctured, at step 520. After a symbol has been punctured, the required number of punctures P1 or P2 is decremented, depending on which puncture distance has been selected, at step 522. Specifically, P1 is decremented if D1 is selected and P2 is decremented if D2 is selected.

A determination is then made whether all P1 and P2 symbols have been punctured, at step 524. This determination can be made by simply checking whether P1 =0 and P2=0. If all P1 and P2 symbols have been punctured, the process terminates. Otherwise, the process returns to step 518 and one of the puncture distances is selected. The process then continues until all P1 and P2 symbols have been punctured.

For a better understanding, the puncturing technique described in FIG. 5A can be applied to the specific example described above in which 31 symbols are generated (i.e., S=31), 20 symbols may be fitted into a frame (i.e., N=20), and 11 symbols need to be punctured (i.e., P=11). Using equations (3) and (4), the puncture distances D1 and D2 can be computed as:

$$D1=\lfloor 31/11 \rfloor=2, \text{ and}$$

$$D2=\lceil 31/11 \rceil=3,$$

respectively. Using equations (5) and (6), the number of punctures at distances D2 and D1 can be computed as:

$$P2=31-11\lfloor 31/11 \rfloor=9, \text{ and}$$

$$P1=11-9=2,$$

respectively. Thus, two punctures are performed at the distance of two and nine punctures are performed at the distance of three.

As noted above, various methods can be used to select which one of the puncture distances, D1 or D2, to use for the next puncture. In one embodiment, one of the puncture distances (e.g., D1) is selected and used for a corresponding number of times (e.g., P1) and then the other puncture distance (e.g., D2) is selected and used for the remaining punctures (e.g., P2). For the above example, two punctures (P1) can be performed at the distance of two (D1) followed by nine punctures (P2) at the distance of three (D2).

In another embodiment, the puncture distances D1 and D2 are alternately selected and used until all punctures at one of the distances are achieved. The remaining punctures are then performed using the other distance. For the above example, the punctures can be performed using the distances of 2, 3, 2, 3, 3, 3, and so on.

In yet another embodiment, the P1 punctures at the distance of D1 are approximately distributed among the P2 punctures at the distance of D2. For example, if the ratio of P1 to P2 is R, then R punctures are performed using the distance D1 for each puncture using the distance D2. For the above example, two punctures are performed using the distance of two and nine punctures are performed using the distance of three. Thus, four or five punctures can be performed using the distance of three for each puncture at the distance of two.

In yet another embodiment, a weighting algorithm can be used to distribute the P1 punctures at the distance of D1 among the P2 punctures at the distance of D2. Let intermediate value F=P1*N2−P2*N1, wherein N1 and N2 are incremental counters indicating the number of punctures at an iterative round. The maximum values for N1 and N2 are chosen so that the puncturing distances P1 and P2 are distributed within the frame. At the beginning of every frame and after every puncture, and while N1+N2<P, the distance D2 is chosen and N2 is incremented by 1 if F<0, otherwise the distance D1 is chosen and N1 is incremented by 1.

In yet another embodiment, the symbol punctures are (approximately) uniformly distributed over the entire frame. In one specific implementation of this embodiment, a "wrap-around" accumulator can be used to store a value that is then used to select the puncture distance for the next puncture. The accumulator is designed to store a value ranging from zero to B, where B is typically a power of twos (e.g., 256, 512, 1024, or some other value). B may also be selected to be larger than or equal to the size of the frame (i.e., B≧N). Initially, the smaller value of the punctures P1 and P2 is determined. Then an accumulation value A is computed as the ratio of the smaller P1 or P2 value to the larger P1 or P2 value, multiplied by the value B. For example, if P1=2, P2=9, and B=1024, then A=(P1/P2)·B=(2/9)•1024≅227. Thereafter, before each puncture, the accumulation value A is added to the value in the accumulator and stored back to the accumulator. If the accumulator wraps around after the accumulation with the value A, then the puncture distance corresponding to the smaller P1 or P2 value is selected for the next symbol puncture.

For the above example, the values in the accumulator can be computed as 227, 454, 681, 908, 111, 338, 565, 792, 1019, 222, and 449, before the 1st, 2nd, 3rd, 4th, 5th, 6th, 7th, 8th, 9th, 10th, and 11th symbol punctures, respectively. The puncture distance D1 is selected for the 5th and 10th symbol punctures since the accumulator has wrapped around and has values of 111 and 222, respectively. By initializing the accumulator with a value other than zero, the first puncture at the distance of two can be different. For example, if the accumulator is initialized at the value of 512, then the 3rd and 7th punctures are performed at the distance of two and the remaining punctures are performed at the distance of three.

For the embodiment shown in FIG. 5A, the computational costs are maintained low. Specifically, only one division operation is performed at step 514 to compute the puncture distances D1 and D2, which is the same number of division operation as for the conventional puncturing technique shown in FIG. 3A. Thus, the embodiment shown in FIG. 5A provides improved performance at equivalent computation costs.

Figure 5B:
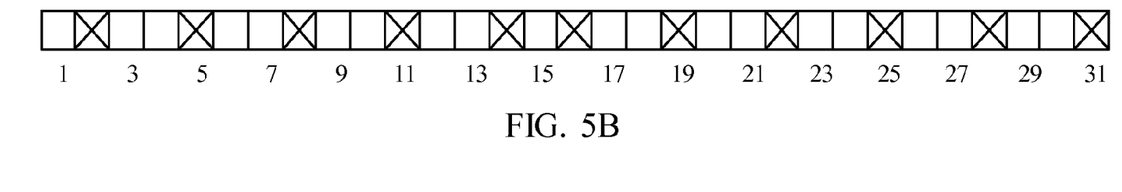
FIG. 5B is a diagram that shows a puncturing example using the symbol puncturing technique described in FIG. 5A.

FIG. 5B is a diagram that shows the results of the puncturing example described above using the symbol puncturing technique shown in FIG. 5A. In this diagram, the 1st and 6th punctures are performed using the distance of two and the other punctures are performed using the distance of three. The punctures at distances D1 and D2 can also be distributed in various other manners, some of which are described above.

The symbol puncturing technique of the invention described in FIG. 5A can be generalized to cover N puncture distances. The N puncture distances D1 through DN can be computed based on S and P (and possibly other parameters) and used to puncture S code symbols. For improved puncturing results (e.g., a more even distribution of the symbol punctures), each of the distances D1 through DN can be selected to be greater than or equal to a minimum puncture distance Dmin defined as:

$$Dmin = \left\lfloor \frac{S}{P} \right\rfloor. \qquad \text{Eq (8)}$$

However, deviations from the above condition can be made and are within the scope of the present invention.

For the N puncture distances, the number of symbol punctures to be performed at each of the puncture distances D1 through DN is then determined. The P1 through PN symbol punctures at the distances of D1 through DN, respectively, are selected such that the following conditions are satisfied:

$$P = \sum_{x=1}^{N} Px, \text{ and} \qquad \text{Eq (9)}$$

$$S = \sum_{x=1}^{N} Px \cdot Dx. \qquad \text{Eq (10)}$$

P1 through PN symbol punctures are then performed at the distances of D1 through DN, respectively.

As noted above, a complementary process is performed at the receiver unit to account for the symbol puncturing performed at the transmitter unit. Specifically, erasures (i.e., "don't knows") are inserted in place of symbols that have been punctured. The erasures are given appropriate weighting during the subsequent decoding process.

Prior to the decoding, N code symbols are received for a particular frame. The number of symbol punctures P that had been performed among S code symbols to generate the N received symbols are then determined. A number of puncture distances, D1 through DN, are then computed based on S and P. P1 through PN symbol punctures that had been performed at the distances of D1 through DN, respectively, are also determined. A puncturing pattern used to puncture the S symbols to generate the N received symbols is then derived based on the P1 through PN symbol punctures at the distances of D1 through DN, respectively. P erasures are then inserted among the N received symbols based on the derived puncturing pattern to generate S recovered symbols, which are then decoded with a particular decoding scheme. Again, for a more even distribution of the erasures/symbol punctures, each of the distances D1 through DN can be selected to be greater than or equal to a minimum puncture distance Dmin defined above.

As a simple example, for the embodiment in which P1 symbol punctures at the distance of D1 are performed followed by P2 symbol punctures at the distance of D2, the receiver unit inserts P1 erasures, one after each D1th received symbols, then inserts P2 erasures, one after each D2th received symbols. The S recovered symbols are then decoded with a particular decoding scheme complementary to the coding scheme used at the transmitter unit.

Figure 6:
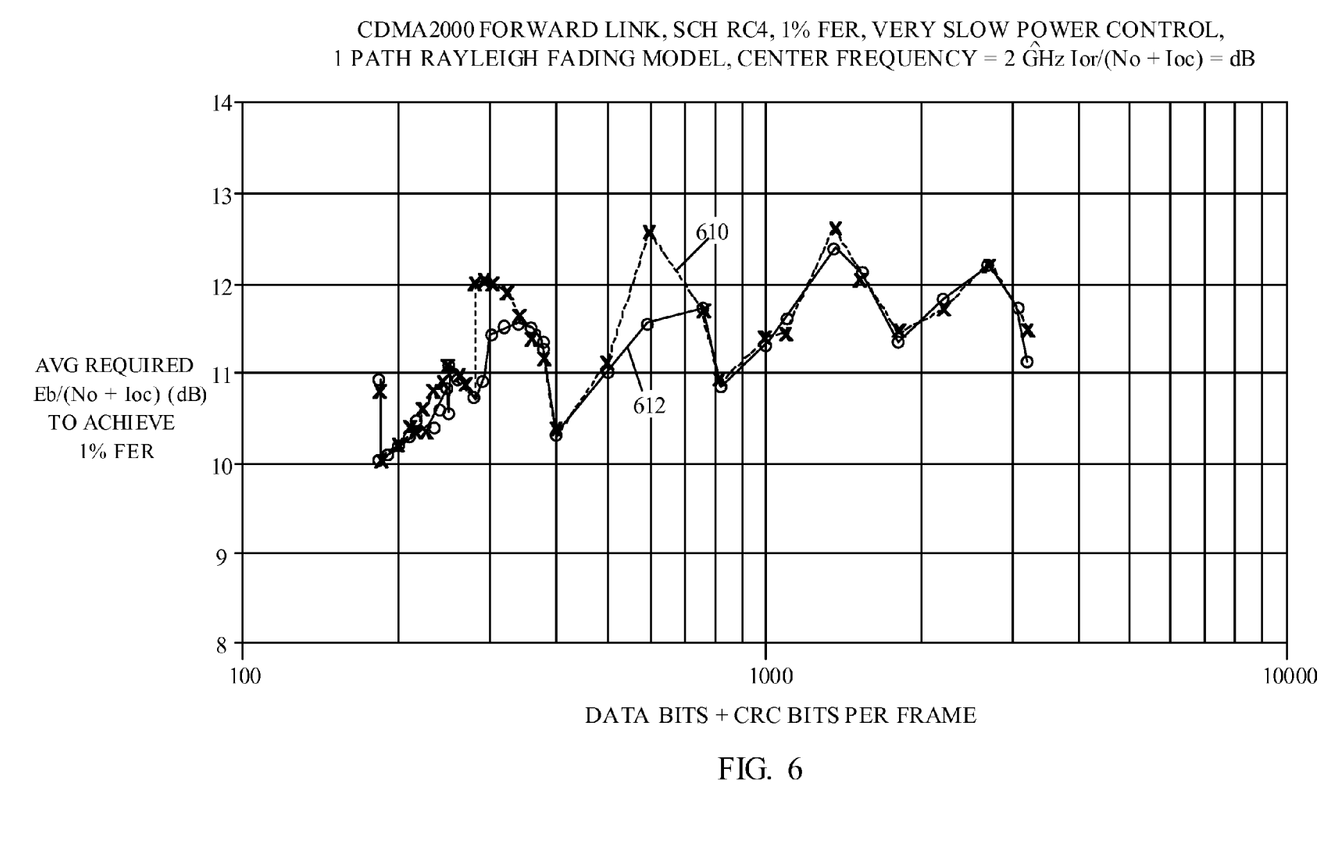
FIG. 6 shows plots of the performance achieved with the conventional puncturing technique versus the puncturing technique of the present invention.

FIG. 6 shows plots of the performance achieved with the conventional puncturing technique described in FIG. 3A versus the puncturing technique of the invention. The performance results are for the forward link (i.e., from a base station to a user terminal) in the CDMA-2000 system. The horizontal axis represents the number of data and CRC bits for each frame. For the CDMA-2000 system, frames of various sizes are available for use, with the frame sizes being an integer multiple of a basic frame size (e.g., available frame sizes are 768·K, where K=1, 2, . . . ). The vertical axis represents the average required energy-per-bit-to-total-noise-plus-interference Eb/(No+Ioc) for a frame error rate (FER) of 1%.

The simulation results for the conventional puncturing technique are shown by a dashed line 610 in FIG. 6. The results indicate some peaks at approximately periodic intervals. For example, peaks are observed at approximately 300, 600, 1200, and 2400 bits. These peaks result from the uneven symbol puncturing generated by the conventional puncturing technique. The peaks represent the need for a higher average energy per bit Eb to maintain the same FER of 1%.

The simulation results for the puncturing technique of the invention are shown by a solid line 612 in FIG. 6. The results indicate improvement in performance at some of the peaks. In particular, improvements of approximately 0.5 dB and 1.0 dB are observed at 300 and 600 bits, respectively.

For clarity, some aspects of the invention have been described specifically for the forward link in the CDMA-2000 system. However, the invention can also be used in other communications systems that employ the same, similar, or different puncturing scheme. For example, the invention can be used to perform puncturing in the W-CDMA system and other CDMA systems. Moreover, the symbol puncturing technique of the present invention can also be used on the reverse link (i.e., from the user terminal to the base station). The puncturing techniques of the invention can be modified to be more suited for the specific system or standard in which it is used.

The symbol puncturing techniques of the invention can be implemented in various manners. For example, the puncturing techniques can be implemented in hardware within one or more application specific integrated circuits (ASICs), digital signal processors (DSPs), programmable logic device (PLD), controllers, micro-controllers, microprocessors, other electronic units designed to perform the functions described herein, or a combination thereof. Alternatively, the puncturing techniques of the invention can be implemented in software or firmware executed on a processor or controller. The puncturing techniques of the present invention can also be implemented in a combination of hardware and software.

The foregoing description of the preferred embodiments is provided to enable any person skilled in the art to make or use the present invention. Various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

What is claimed is:

1. A method for transmitting a frame of data comprising:
receiving a number of symbols S to be fitted into said data frame having a capacity of N symbols, where S is greater than N;
determining a number of symbols P to be punctured from among the S received symbols such that remaining unpunctured symbols fit into the frame;
computing a plurality of puncture distances D1 through DN based on the number of received symbols S and the number of symbol punctures P, wherein each successive puncture distance is based on the ratio of received symbols S and symbol punctures P remaining after a previous puncture distance has been computed;
determining a particular number of symbol punctures to be performed for each of the plurality of puncture distances D1 through DN, wherein P1 through PN symbol punctures are to be performed at the puncture distances D1 through DN, respectively, and wherein a sum of P1 through PN is equal to P; and
performing P1 through PN symbol punctures at the puncture distances D1 through DN, respectively.

2. The method as recited in claim 1 further comprising:
puncturing said number of symbols S in accordance with said plurality of puncture distances to produce a punctured number of data symbols wherein said computing of at least one said plurality of puncture distances is computed by at least one of a floor operator and a ceiling operator based on the number of received symbols S and the number of symbol punctures P.

3. The method as recited in claim 1 further comprising:
coding a plurality of data bits in accordance with a coding scheme to generate said number of symbols S.

4. The method as recited in claim 1 further comprising:
interleaving said punctured number of data symbols before said transmitting.

5. An apparatus for transmitting a frame of data comprising:
means for receiving a number of symbols S to be fitted into said data frame having a capacity of N symbols, where S is greater than N;
means for determining a number of symbols P to be punctured from among the S received symbols such that remaining unpunctured symbols fit into the frame;
means for computing a plurality of puncture distances D1 through DN based on the number of received symbols S and the number of symbol punctures P, wherein each successive puncture distance is based on the ratio of received symbols S and symbol punctures P remaining after a previous puncture distance has been computed;
means for determining a particular number of symbol punctures to be performed for each of the plurality of puncture distances D1 through DN, wherein P1 through PN symbol punctures are to be performed at the puncture distances D1 through DN, respectively, and wherein a sum of P1 through PN is equal to P; and means for performing P1 through PN symbol punctures at the puncture distances D1 through DN, respectively.

6. The apparatus as recited in claim 5 further comprising:
wherein said means for computing includes means for computing at least one of said plurality of puncture distances by at least one of a floor operator and a ceiling operator based on the number of received symbols S and the number of symbol punctures P.

7. The apparatus as recited in claim 5 further comprising:
an encoder for coding a plurality of data bits in accordance with a coding scheme to generate said number of symbols S.

8. The apparatus as recited in claim 5 further comprising:
an interleaver fro interleaving said punctured number of data symbols before said transmitting.

9. An apparatus for puncturing symbols in a communication system, comprising:
means for causing a computer to receive a number of symbols S to be fitted into a data frame having a capacity of N symbols, where S is greater than N;
means for causing a computer to determine a number of symbols P to be punctured from among the S received symbols such that remaining unpunctured symbols fit into the frame;
means for causing a computer to compute a plurality of puncture distances D1 through DN based on the number of received symbols S and the number of symbol punctures P;
means for causing a computer to determine a particular number of symbol punctures to be performed for each of the plurality of puncture distances D1 through DN, wherein P1 through PN symbols punctures are to be performed at the puncture distances of D1 through DN, and wherein a sum P1 through PN is equal to P;
means for causing a computer to perform P1 though PN symbol punctures at the puncture distance of D1 though DN, respectively, and
means for causing a computer to compute two puncture distances D1 and D2 based on the number of received symbols S and the number symbol punctures P, wherein the puncture distances D1 and D2 are computed as respectively:

$$D1 = \left\lfloor \frac{S}{P} \right\rfloor \text{ and } D2 = \left\lceil \frac{S}{P} \right\rceil$$

where $\lfloor \; \rfloor$ denotes a floor operator, and $\lceil \; \rceil$ denotes a ceiling operator.

10. An apparatus for puncturing symbols for a data frame, comprising:
a receiver configured to receive a number of symbols S to be fitted into said data frame having a capacity of N symbols, where S is greater than N;
a processor configured to
determine a number of symbols P to be punctured from among the S received symbols such that remaining unpunctured symbols fit into the frame;
compute a plurality of puncture distances D1 through DN based on the number of received symbols S and the number of symbol punctures P, wherein each successive puncture distance is based on the ratio of received symbols S and symbol punctures P remaining after a previous puncture distance has been computed;
determine a particular number of symbol punctures to be performed for each of the plurality of puncture distances D1 through DN, wherein P1 through PN symbol punctures are to be performed at the puncture distances D1 through DN, respectively, and wherein a sum of P1 through PN is equal to P; and a symbol puncturer configured to perform P1 through PN symbol punctures at the puncture distances D1 through DN, respectively.

11. A processor comprising:
a processing circuit configured to
receive a number of symbols S to be fitted into said data frame having a capacity of N symbols, where S is greater than N;
determine a number of symbols P to be punctured from among the S received symbols such that remaining unpunctured symbols fit into the frame;
compute a plurality of puncture distances D1 through DN based on the number of received symbols S and the number of symbol punctures P, wherein each successive puncture distance is based on the ratio of received symbols S and symbol punctures P remaining after a previous puncture distance has been computed;
determine a particular number of symbol punctures to be performed for each of the plurality of puncture distances D1 through DN, wherein P1 through PN symbol punctures are to be performed at the puncture distances D1 through DN, respectively, and wherein a sum of P1 through PN is equal to P; and
perform P1 through PN symbol punctures at the puncture distances D1 through DN, respectively.

12. A machine-readable medium having one or more instructions for puncturing a symbol stream, which when executed by a processor causes the processor to:
receive a number of symbols S to be fitted into said data frame having a capacity of N symbols, where S is greater than N;
determine a number of symbols P to be punctured from among the S received symbols such that remaining unpunctured symbols fit into the frame;
compute a plurality of puncture distances D1 through DN based on the number of received symbols S and the number of symbol punctures P, wherein each successive puncture distance is based on the ratio of received symbols S and symbol punctures P remaining after a previous puncture distance has been computed;
determine a particular number of symbol punctures to be performed for each of the plurality of puncture distances D1 through DN, wherein P1 through PN symbol punctures are to be performed at the puncture distances D1 through DN, respectively, and wherein a sum of P1 through PN is equal to P; and
perform P1 through PN symbol punctures at the puncture distances D1 through DN, respectively.

* * * * *